United States Patent
Kim et al.

(10) Patent No.: US 7,323,420 B2
(45) Date of Patent: *Jan. 29, 2008

(54) METHOD FOR MANUFACTURING MULTI-THICKNESS GATE DIELECTRIC LAYER OF SEMICONDUCTOR DEVICE

(75) Inventors: Kyung-soo Kim, Euijeongbu (KR); Young-wug Kim, Seoul (KR); Chang-bong Oh, Seongnnam (KR); Hee-sung Kang, Seongnam (KR); Hyuk-ju Ryu, Guri (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 11/652,186

(22) Filed: Jan. 11, 2007

(65) Prior Publication Data
US 2007/0117391 A1 May 24, 2007

Related U.S. Application Data

(62) Division of application No. 10/685,738, filed on Oct. 15, 2003, now Pat. No. 7,179,750.

(30) Foreign Application Priority Data
Nov. 1, 2002 (KR) .................... 02-67545

(51) Int. Cl.
*H01L 21/302* (2006.01)
(52) U.S. Cl. .................. 438/723; 438/724; 438/745
(58) Field of Classification Search .......... 438/706, 438/710, 712, 714, 723, 724, 745, 756, 757
See application file for complete search history.

(56) References Cited

U.S. PATENT DOCUMENTS

| | | | |
|---|---|---|---|
| 5,128,274 A * | 7/1992 | Yabu et al. .............. 438/452 |
| 5,811,336 A * | 9/1998 | Kasai ..................... 438/271 |
| 6,087,236 A | 7/2000 | Chau et al. |
| 6,303,521 B1 * | 10/2001 | Jenq ....................... 438/770 |
| 6,383,861 B1 | 5/2002 | Gonzalez et al. |
| 6,436,771 B1 | 8/2002 | Jang et al. |
| 6,461,973 B1 * | 10/2002 | Hui et al. ................ 438/712 |
| 6,566,213 B2 | 5/2003 | En et al. |
| 6,583,013 B1 * | 6/2003 | Rodder et al. ........... 438/276 |
| 6,756,635 B2 | 6/2004 | Yasuda et al. |
| 6,867,445 B2 | 3/2005 | Jang |
| 7,179,750 B2 * | 2/2007 | Kim et al. .............. 438/723 |

(Continued)

Primary Examiner—Kin-Chan Chen
(74) Attorney, Agent, or Firm—Mills & Onello LLP

(57) ABSTRACT

In a method for manufacturing a multi-thickness gate dielectric layer of a semiconductor device, a first dielectric layer is formed on a semiconductor substrate. A second dielectric layer is formed using a different dielectric material from the material constituting the first dielectric layer on the first dielectric layer. A portion of the second dielectric layer is selectively removed so as to selectively expose the first dielectric layer under the second dielectric layer. A portion of the exposed first dielectric layer is selectively removed so as to selectively expose the semiconductor substrate under the exposed first dielectric layer. Thereafter, a third dielectric layer having a thinner thickness than the first dielectric layer is formed on the exposed semiconductor substrate. As a result, a gate dielectric layer is formed to include a thick portion formed of the first dielectric layer and remaining second dielectric layer, a medium-thickness portion formed of the remaining first dielectric layer, and a thin portion formed of the third dielectric layer.

9 Claims, 4 Drawing Sheets

U.S. PATENT DOCUMENTS

| | | |
|---|---|---|
| 2002/0119615 A1 | 8/2002 | Kim et al. |
| 2003/0102504 A1 | 6/2003 | Chem et al. |
| 2003/0214001 A1 | 11/2003 | Yasuda et al. |
| 2004/0023451 A1* | 2/2004 | Lee et al. .................. 438/201 |
| 2004/0061527 A1* | 4/2004 | Knee ........................... 326/83 |
| 2004/0113229 A1 | 6/2004 | Gonzalez et al. |
| 2004/0132253 A1* | 7/2004 | Hori ........................... 438/275 |

* cited by examiner

METHOD FOR MANUFACTURING MULTI-THICKNESS GATE DIELECTRIC LAYER OF SEMICONDUCTOR DEVICE

This application is a divisional of U.S. application Ser. No. 10/685,738, filed on Oct. 15, 2003, now U.S. Pat. No. 7,179,750, which relies for priority upon Korean Patent Application No. 2002-67545, filed on Nov. 1, 2002, the contents of which are herein incorporated by reference in their entirety.

BACKGROUND OF THE INVENTION

1. Field of the Invention

The present invention relates to semiconductor devices, and more particularly, to a method for manufacturing a multi-thickness gate dielectric layer used as a gate oxide for semiconductor devices.

2. Description of the Related Art in the fabrication of a semiconductor device, devices, such as various kinds of transistors, are integrated onto a common substrate. For example, system-on-chip (SOC) devices are formed of various transistors or devices which are integrated on the same substrate. Namely, a low standby power device, a high performance device, an I/O device, and an analog device are integrated on the same substrate to constitute a single semiconductor device, e.g., an SOC device.

It is preferable that each of the various kinds of transistors includes an appropriate gate oxide, or a gate dielectric layer, having a thickness that is appropriate for operation thereof. For instance, in the case of an I/O device, an oxide layer of approximately 50 Å or more in thickness is required to form a gate dielectric layer of a transistor, although the thickness of the gate dielectric layer depends on the design rule or the integration level of the semiconductor device. For clarity of explanation, such thickness of the gate dielectric layer is understood as an equivalent oxide thickness parameter ($T_{eq}$). However, in a cell or core of a semiconductor device such as a transistor constituting a static random access memory (SRAM), it is also preferable to use a gate dielectric layer of a thickness of approximately 30 Å or less so that the transistor can perform operations optimally. That is, it is necessary that a gate dielectric layer having different thicknesses be formed on the same substrate constituting a single semiconductor device for regions of the device that include transistors that serve different functions.

Furthermore, different operating voltages are applied to devices that serve different purposes. For example, an operating voltage of approximately 3.3V is applied to a transistor adopted for an I/O device, while a relatively low operating voltage of approximately 2.5V or 1.0V may be applied to a transistor adopted for a device of a core or cell. Thus, each of the transistors preferably has a gate dielectric layer of a respectively different thickness so as to be suitable for the operating voltage.

It is presently known that a method for manufacturing a gate dielectric layer having different thicknesses may be realized by a dual strip technique. According to the dual strip technique, a silicon oxide layer is formed on a semiconductor substrate to a relatively thick thickness suitable for a transistor or other devices that require a thick gate dielectric layer. Thereafter, a portion of the thick silicon oxide layer is selectively removed from the semiconductor substrate, where a device required for a relatively thinner gate dielectric layer will be embodied, to partially expose a surface of the semiconductor substrate. A new silicon oxide layer is then formed to a relatively thinner thickness on the exposed surface of the semiconductor substrate. In this manner, a gate dielectric layer having different thicknesses in different regions of the device is formed.

However, in the method for manufacturing the gate dielectric layer having two different thicknesses using the above dual strip technique, it is difficult to adjust and control the thicknesses of the gate dielectric layer. For instance, because the same silicon oxide layer is grown twice, it is difficult to uniformly form the gate dielectric layer. That is, when a second silicon oxide layer is grown to a relatively thin thickness following the selective stripping, the thickness of the pre-formed thick silicon oxide layer may be unevenly changed. This is because the same silicon oxide layer is used twice for the gate dielectric layer to achieve the different thicknesses. In this case, the thickness uniformity of the gate dielectric layer is degraded, and this results in deterioration of characteristics of the resulting transistors. In particular, when a difference in the thickness between a thick portion and a thin portion of the gate dielectric layer is comparatively small, it becomes more difficult to control the thickness of the gate dielectric layer.

SUMMARY OF THE INVENTION

The present invention provides a method for manufacturing a multi-thickness gate dielectric layer of a semiconductor device, in which the thickness of the gate dielectric layer can be minutely adjusted so as to embody a high thickness uniformity, when the semiconductor device includes a multi-thickness gate dielectric layer formed on a substrate to respectively different thicknesses.

In accordance with an aspect of the present invention, there is provided a method for manufacturing a gate dielectric layer having several thicknesses on a semiconductor substrate.

The method for manufacturing the gate dielectric layer comprises forming a first dielectric layer on a semiconductor substrate. A second dielectric layer is then formed on the first dielectric layer using a different dielectric material from that of the first dielectric layer. A portion of the second dielectric layer is selectively removed so as to selectively expose a portion of the first dielectric layer under the second dielectric layer, thereby forming a gate dielectric layer including a relatively thicker portion and a relatively thinner portion. The relatively thicker portion includes the first dielectric layer and the remaining second dielectric layer, while the relatively thinner portion includes only the exposed first dielectric layer.

Alternatively, the method for manufacturing the gate dielectric layer comprises forming a first dielectric layer on a semiconductor substrate. A second dielectric layer is then formed on the first dielectric layer using a different dielectric material from that of the first dielectric layer. A portion of the second dielectric layer is selectively removed so as to selectively expose a portion of the first dielectric layer under the second dielectric layer. Then, a portion of the exposed first dielectric layer is selectively removed so as to selectively expose the semiconductor substrate under the exposed first dielectric layer. A third dielectric layer is formed on the exposed semiconductor substrate to have a thickness that is thinner than that of the first dielectric layer. Thus, a gate dielectric layer having three different thicknesses is formed. That is, the gate dielectric layer includes a relatively thicker portion formed of the first dielectric layer and the remaining second dielectric layer, a relatively medium-thickness portion formed of the remaining portion of the exposed first dielectric layer, and a relatively thinner portion formed of only the third dielectric layer.

Here, the first, second, or third dielectric layer may be formed of silicon oxide, silicon nitride, hafnium oxide, aluminum oxide, zirconium oxide, or tantalum oxide.

The first or third dielectric layer may be formed of thermal oxide. The first or third dielectric layer may be formed of silicon oxide using rapid thermal oxidation (RTO).

The first, second, or third dielectric layer may be formed of hafnium oxide or aluminum oxide using atomic layer deposition (ALD).

The selective removal of the second dielectric layer may comprise introducing a first photoresist pattern on the second dielectric layer, and then primarily etching the exposed second dielectric layer using dry or wet etching, by using the first photoresist pattern as an etch mask. The selective removal of the portion of the exposed first dielectric layer may comprise introducing a second photoresist pattern covering the remaining second dielectric layer and the portion of the exposed first dielectric layer and then secondarily etching the portion of the exposed first dielectric layer using dry or wet etching, by using the second photoresist pattern as an etch mask. At this time, while the primary etching is performed, the etch rate of the second dielectric layer is higher than that of the first dielectric layer.

The method for manufacturing the gate dielectric layer may further comprise nitridizing a surface of the gate dielectric layer.

The third dielectric layer may be formed by deposition and be extended even on the remaining second and first dielectric layers.

The method for manufacturing the gate dielectric layer may further-comprise forming a third dielectric layer on the second dielectric layer using a different dielectric material from the second dielectric layer and then selectively removing a portion of the third dielectric layer so as to selectively expose the second dielectric layer under the third dielectric layer. The gate dielectric layer may have a portion that consists of the remaining third dielectric layer, second dielectric layer, and first dielectric layer deposited over one another in sequence.

According to the present invention, a gate dielectric layer including regions with respectively different thicknesses is provided. The resulting gate dielectric layer has a very high uniformity of thickness in each of the regions.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION OF PREFERRED EMBODIMENTS

Figure 1:
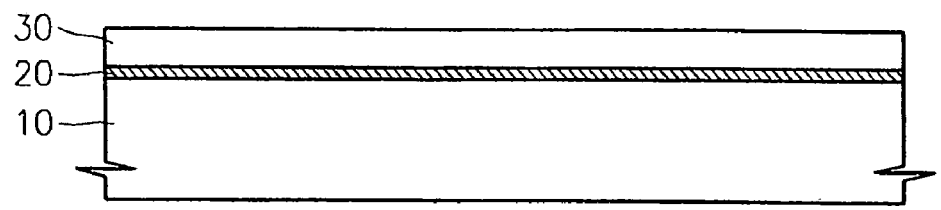
FIGS. 1 through 3 are schematic cross-sectional views illustrating a method for manufacturing a multi-thickness gate dielectric layer of a semiconductor device in accordance with a first preferred embodiment of the present invention.

The present invention will now be described more fully with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the concept of the invention to those skilled in the art. In the drawings, the shape of elements is exaggerated for clarity, and the same reference numerals in different drawings represent the same element. Further, it will be understood that when a layer is referred to as being "on" another layer or substrate, it can be directly on the other layer or substrate, or intervening layers may also be present.

In embodiments of the present invention, methods for manufacturing a multi-thickness gate dielectric layer by forming different types of dielectric. materials as a multi-layered structure are provided. Such a multi-thickness dielectric layer enables regions having respectively different thicknesses to exhibit different etch rates so as to have sufficient etch selectivity with respect to each other. Accordingly, a thickness required of the gate dielectric layer may be uniformly embodied. Also, after dielectric material layers are deposited or grown into a multi-layered structure, a portion of the multi-layered structure is removed. Alternatively, after removing the portion of the multi-layered structure, an additional dielectric layer may be deposited or grown. This allows a gate dielectric layer having a thin portion and a thick portion to have a high uniformity of thickness. Furthermore, when different dielectric materials are deposited or grown and then a layer is partially removed, a sufficient etch selectivity can be embodied between different dielectric material layers. Thus, it becomes highly feasible to increase the thickness uniformity of a gate dielectric layer. In addition, a multi-thickness gate dielectric layer having two or more different thicknesses can be easily embodied.

Embodiment 1

Figure 2:
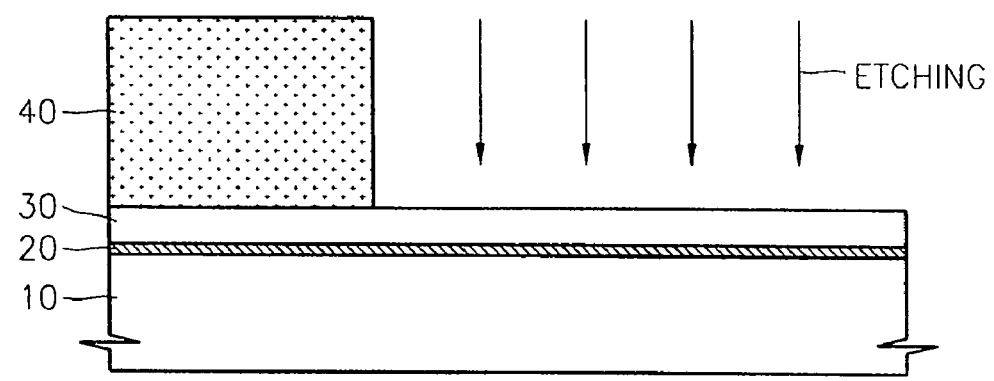
Figure 3:
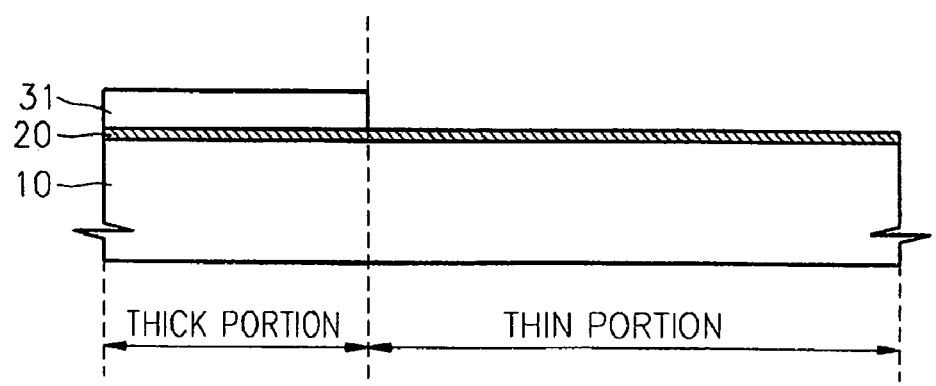

FIGS. 1 through 3 are schematic cross-sectional views illustrating a method for manufacturing a multi-thickness gate dielectric layer of a semiconductor device in accordance with a first preferred embodiment of the present invention.

Referring to FIG. 1, a first dielectric layer 20 and a second dielectric layer 30 are formed on a semiconductor substrate 10. Specifically, a first dielectric layer 20 is deposited or grown on the semiconductor substrate 10, i.e., on an active region. Before forming the first dielectric layer 20, although not shown in the drawings, an isolation region for defining the active region may be embodied on the semiconductor substrate 10.

The first dielectric layer 20 may be formed by growing or depositing a dielectric material such as silicon oxide ($SiO_2$). In the case where the first dielectric layer 20 is formed of silicon oxide, a thermal oxide layer may be grown on the semiconductor substrate 10 in order to obtain a high-quality dielectric layer that can serve as a gate dielectric layer. In this case, to improve the characteristics of the gate dielectric layer, the thermal oxide layer constituting the first dielectric layer 20 may be treated by nitridization. That is, nitrogen ions may be doped into the first dielectric layer 20 by 3 to 5%.

A silicon oxide layer may be formed using a rapid thermal oxidation (RTO) process to serve as the first dielectric layer 20. The RTO process may be performed in the atmosphere of $O_2$ gas, $N_2O$ gas, or water vapor. In this case, the nitridization process may also be performed by adjusting the partial pressure of $N_2$ gas or $N_2O$ gas in the atmosphere of the RTO process.

While the first dielectric layer 20 may be formed of silicon oxide as described above, it may also be formed of other dielectric materials, for example, silicon nitride ($Si_3N_4$). Silicon nitride may be deposited using chemical vapor deposition (CVD).

Alternatively, the first dielectric layer 20 may be formed of high k-dielectric materials, for example, hafnium oxide ($HfO_2$) or aluminium oxide ($Al_2O_3$). The hafnium oxide or aluminium oxide may be deposited on the semiconductor substrate 10 using a layer-by-layer deposition method, for example, atomic layer deposition (ALD).

In particular, since aluminium oxide can be used to form a very uniform and dense layer by using the ALD process, the second or first dielectric layer 30 or 20 may be formed of aluminium oxide. The hafnium oxide can be formed using the ALD process and enable improvements in the characteristics of a transistor when used for a gate dielectric layer.

High k-dielectric materials, for example, zirconium oxide ($ZrO_2$) or tantalum oxide ($Ta_2O_5$), may be also used to form the first dielectric layer 20. These dielectric materials may be deposited using MOCVD.

Meanwhile, the first dielectric layer 20 may be substantially used to form a gate dielectric layer at a region where the gate dielectric layer is required to have a relatively thinner thickness. Accordingly, the first dielectric layer 20 may be formed to a required thinner thickness of, for example, approximately 1 to 30 Å. That is, in the case of an SRAM formed at a cell region of a semiconductor device, the first dielectric layer 20 may be formed, for example, to a thickness of approximately 10 to 12 Å and in some cases may be formed to a thickness of approximately 16 to 18 Å. While the thickness may represent a substantial thickness, it preferably refers to an equivalent oxide thickness $T_{eq}$.

After forming the first dielectric layer 20, the second dielectric layer 30 is formed on the first dielectric layer 20. At this time, the second dielectric layer 30 may be formed of the foregoing dielectric materials such as silicon oxide, silicon nitride, hafnium oxide, aluminium oxide, zirconium oxide, or tantalum oxide. However, the second dielectric layer 30 is preferably formed of a different material from the dielectric material constituting the first dielectric layer 20.

For instance, when the first dielectric layer 20 is formed of silicon oxide, the second dielectric layer 30 may be formed of dielectric materials other than the silicon oxide, for example, hafnium oxide, aluminium oxide, zirconium oxide, or tantalum oxide.

Referring to FIG. 2, a photoresist pattern 40 is introduced on the second dielectric layer 30, and then a portion of the second dielectric layer 30 is selectively removed using the photoresist pattern 40 as an etch mask. The photoresist pattern 40 shields and protects the second dielectric layer 30 formed at a region where a thick gate dielectric layer is required while exposing a surface of the second dielectric layer 30 where a thin gate dielectric layer is required.

By using the photoresist pattern 40 as an etch mask, the exposed portion of the second dielectric layer 30 is etched and removed. At this time, the etching process may be a dry or wet etch process. Also, the etching process may be performed under the appropriate etching conditions so as to selectively etch the portion of second dielectric layer 30. Thus, the exposed portion of the second dielectric layer 30 is completely removed, exposing the surface of the first dielectric layer 20 thereunder.

In this case, the etching process is preferably carried out such that the material constituting the second dielectric layer 30 has a sufficient etch selectivity with respect to the material constituting the first dielectric layer 20. In practice, because the second dielectric layer 30 is formed of a different material from that of the first dielectric layer 20, it becomes easier to embody such an etch selectivity.

As described above, since a sufficient etch selectivity is easily embodied during the etching process for removing the exposed surface of the second dielectric layer 30, the exposed surface of the first dielectric layer 20 may be effectively protected from etching damage. As a result, the etching process allows the gate dielectric layer formed of the first and second dielectric layers 20 and 30 to have resulting different thicknesses as illustrated in FIG. 3.

Referring to FIG. 3, the second dielectric layer 30 is partially removed to form a thick portion, which includes the remaining second dielectric layer 31 and-the first dielectric layer 20, at a region where a relatively thicker gate dielectric layer is required. The thick portion may, for example, have a thickness of approximately 50 Å or higher. The thickness of the thick portion is preferably suitable for an operation of a transistor adopted for power devices or analog devices. For instance, the thickness of the thick portion is proper for a relatively higher operating voltage of approximately 3.3V.

In addition, a thin portion, which includes only the first dielectric layer 20, is located a region where a thin gate dielectric layer is required. Since the thin portion includes only the first dielectric layer 20, the thin portion may, for example, have a thickness of approximately 10 to 12 Å. Thus, the thickness of the thin portion may be adequate for a transistor adopted for SRAM devices or a transistor operated at an operating voltage of approximately 1.0V.

Thus, the entire gate dielectric layer is constructed to have both the thin and thick portions on the same semiconductor substrate 10.

The foregoing method for manufacturing the multi-thickness gate dielectric layer having both the thin and thick portions allows the resultant gate dielectric layer to have a uniform thickness in each region.

Referring to FIG. 1 again, both the first and second dielectric layers 20 and 30 are deposited or grown on a flat lower layer. Accordingly, it becomes easier to adjust the thickness of each of the first and second dielectric layers 20 and 30. According to the conventional approach, in which a thin portion was formed by growing the same dielectric material as a thick portion, a thin silicon oxide layer was grown in the state where a thick portion was already formed. At that time, the thick portion was affected by the growth of the silicon oxide layer and this lead to a change in the thickness of the thick portion. Accordingly, it was difficult to embody a thickness uniformity required of a gate dielectric layer for a transistor. In particular, it was more difficult to adjust the thick portion than the thin portion.

On the other hand, in the present invention as described in the first embodiment, the thicknesses of both the thick portion and the thin portion depend on the thicknesses of the deposited or grown first and second dielectric layers 20 and 30. Accordingly, it becomes easier to adjust the thickness of each of the gate dielectric layer 20, to have a uniform thickness in each region.

While an example of a gate dielectric layer having two different thicknesses is explained in the first embodiment, it is also possible to embody a gate dielectric layer having more than two different thicknesses. That is, additional layers, such as a third dielectric layer, formed of different dielectric materials can be sequentially formed on the second dielectric layer 30 presented in the first embodiment and then successively etched.

Embodiment 2

In the first embodiment, the method for manufacturing a gate dielectric layer having two different thicknesses is exemplarily described. However, in a second embodiment, a method for manufacturing a gate dielectric layer having three different thicknesses will be explained as another example of the present invention. The method described in the second embodiment may be repeatedly performed, thereby enabling the formation of a gate dielectric layer having more than three different thicknesses.

FIGS. 4 through 9 are schematic cross-sectional views illustrating a method for manufacturing a multi-thickness gate dielectric layer of a semiconductor device in accordance with the second preferred embodiment of the present invention.

Figure 4:
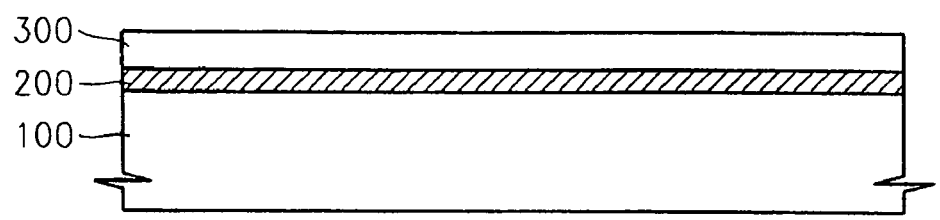
FIGS. 4 through 9 are schematic cross-sectional views illustrating a method for manufacturing a multi-thickness gate dielectric layer of a semiconductor device in accordance with a second preferred embodiment of the present invention.

Referring to FIG. 4, a first dielectric layer 200 and a second dielectric layer 300 are formed on a semiconductor substrate 100. Specifically, the first dielectric layer 200 is deposited or grown on the semiconductor substrate 100, i.e., on an active region. Before forming the first dielectric layer 200, although not shown in the drawings, device isolation for defining the active region may be embodied on the semiconductor substrate 100.

The first dielectric layer 200 may be formed by growing or depositing a dielectric material such as silicon oxide ($SiO_2$). Alternatively, the first dielectric layer 200 may be formed of dielectric materials such as silicon nitride ($Si_3N_4$), hafnium oxide ($HfO_2$), aluminium oxide ($Al_2O_3$), zirconium oxide ($ZrO_2$), or tantalum oxide ($Ta_2O_5$).

After forming the first dielectric layer 200, the second dielectric layer 300 is formed on the first dielectric layer 200. At this time, the second dielectric layer 300 may be formed of the foregoing dielectric materials, for example, silicon oxide, silicon nitride, hafnium oxide, aluminium oxide, zirconium oxide, or tantalum oxide. However, the second dielectric layer 300 is preferably formed of a different material from that of the first dielectric layer 200.

For instance, when the first dielectric layer 200 is formed of silicon oxide, the second dielectric layer 300 may be formed of dielectric materials other than the silicon oxide, for example, hafnium oxide, aluminium oxide, zirconium oxide, or tantalum oxide. If the first dielectric layer 200 is not formed of silicon oxide, the second dielectric layer 300 may be formed of silicon oxide. In such a case, silicon oxide may be deposited using CVD.

Figure 5:
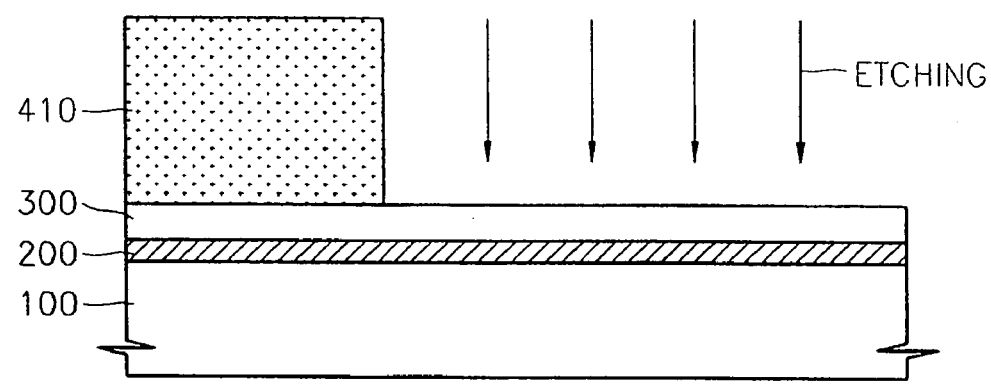

Referring to FIG. 5, a first photoresist pattern 410 is introduced on the second dielectric layer 300, and then a portion of the second dielectric layer 300 is selectively removed using the photoresist pattern 410 as an etch mask. The first photoresist pattern 410 shields and protects the second dielectric layer 200 formed at a region where a thick gate dielectric layer is required while exposing a surface of the second dielectric layer 300 formed at other regions.

By using the first photoresist pattern 410 as an etch mask, the exposed portion of the second dielectric layer 300 is etched and removed. At this time, the etching process may be a dry or wet etch process. Also, the etching process may be performed under the appropriate etching conditions so as to selectively etch the second dielectric layer 300. Thus, the exposed portion of the second dielectric layer 300 is completely removed, exposing the surface of the first dielectric layer 200 thereunder.

In this case, the etching process is preferably carried out such that the material constituting the second dielectric layer 300 has a sufficient etch selectivity with respect to the material constituting the first dielectric layer 200. In practice, because the second dielectric layer 300 is formed of a different material from the first dielectric layer 200, it becomes easier to embody such an etch selectivity. As described above, since a sufficient etch selectivity is easily embodied during the etching process for removing the exposed surface of the second dielectric layer 300, the exposed surface of the first dielectric layer 200 may be effectively protected from etching damage.

Figure 6:
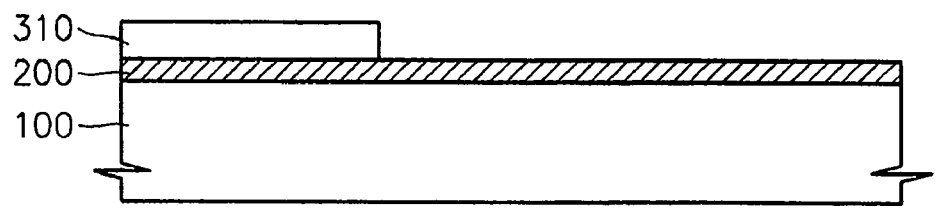

Referring to FIG. 6, the second dielectric layer 300 is partially removed to form a thick portion, which includes the remaining second dielectric layer 310 and first dielectric layer 200, at a region where a relatively thicker gate dielectric layer is required. The thick portion may be formed, for example, to a thickness of approximately 50 Å or higher. The thickness of the thick portion is preferably suitable for an operation of a transistor adopted for power devices or analog devices. For instance, the thickness of the thick portion is proper for a relatively higher operating voltage of approximately 3.3V.

Figure 7:
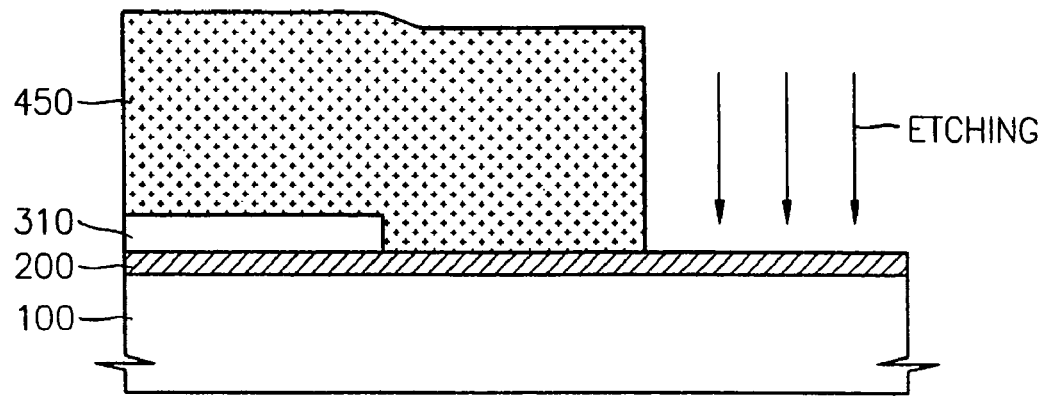

Referring to FIG. 7, a second photoresist pattern 450 is introduced to cover the remaining second dielectric layer 310 and a portion of the first dielectric layer 200, and then a portion of the first dielectric layer 200 is selectively removed using the photoresist pattern 450 as an etch mask. The second photoresist pattern 450 shields and protects the remaining second dielectric layer 310 as well as the first dielectric layer 200 formed at a region where a gate dielectric layer having a medium-thickness is required, while exposing a surface of the first dielectric layer 200 formed at other regions.

By using the second photoresist pattern 450 as an etch mask, the exposed portion of the first dielectric layer 200 is etched and removed. At this time, the etching process may be a dry or wet etch process. Also, the etching process may be performed under the appropriate etching conditions so as to selectively etch the first dielectric layer 200. Thus, the exposed second dielectric layer 200 is completely removed during the etching process, thereby exposing the semiconductor substrate 100 thereunder.

In this case, the etching process is preferably carried out such that the material constituting the first dielectric layer 200 has a sufficient etch selectivity with respect to the material constituting the semiconductor substrate which is formed, for example, of silicon.

Figure 8:
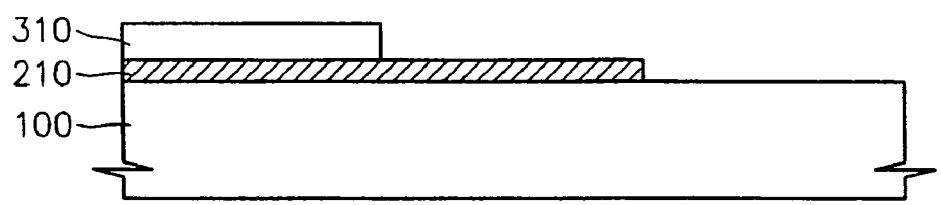

Referring to FIG. 8, partially removing the exposed first dielectric layer 200 results in the thick portion, which includes the remaining second dielectric layer 310 and remaining first dielectric layer 210, at a region where the thickest gate dielectric layer is required and a portion having a medium-thickness (hereinafter, referred to as a "medium-thickness portion"), which includes only the remaining first dielectric layer 210. The medium-thickness portion may be formed to a thickness of approximately 30 Å. The thickness of the medium-thickness portion is preferably suitable for a transistor operated at an operating voltage of approximately 2.2V.

Figure 9:
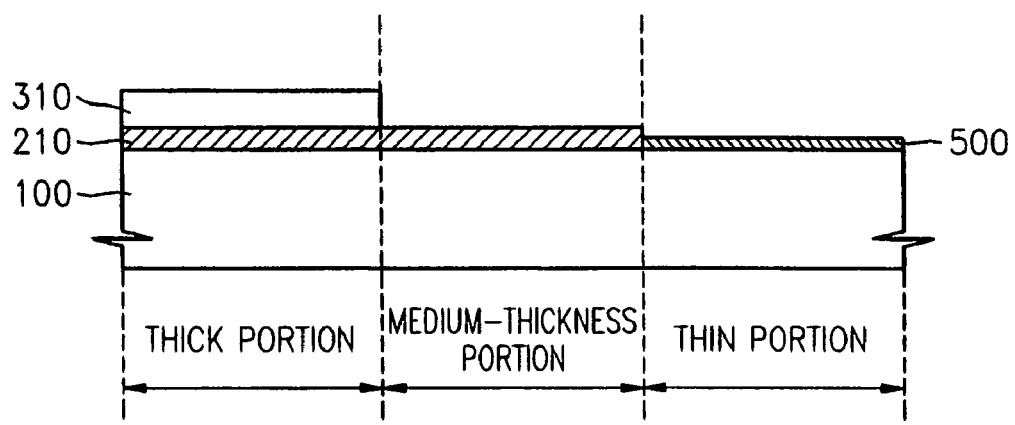

Referring to FIG. 9, a third dielectric layer 500 is grown on the semiconductor substrate 100. The third dielectric layer 500 may be formed by growing a dielectric material such as silicon oxide ($SiO_2$). When the third dielectric layer 500 is formed of silicon oxide, a thermal oxide layer may be grown on the exposed surface of the semiconductor substrate 100 in order to obtain a high-quality dielectric layer that can serve as a gate dielectric layer. In this case, to improve the characteristics of the gate dielectric layer, the thermal oxide layer constituting the third dielectric layer 500 may be nitridized. That is, nitrogen ions may be doped into the third dielectric layer 500 by 3 to 5%. The nitridization process may be a rapid thermal oxidation (RTO) process performed in an atmosphere of $N_2O$ gas.

Meanwhile, silicon oxide may be grown by using the foregoing RTO process. In some cases, new silicon oxide may be grown even on the remaining first dielectric layer 210 and second dielectric layer 310. However, such growth is negligible. In particular, when the remaining first dielectric layer 210 and second dielectric layer 310 are formed of dielectric materials other than the silicon oxide, the silicon oxide is not readily grown on the first and second dielectric layers 210 and 310.

The third dielectric layer 500 is formed to constitute a thin portion of the gate dielectric layer. Accordingly, the third dielectric layer 500 may have a thickness of approximately 1 to 20 Å, preferably, 10 to 12 Å. Thus, the thin portion formed of the third dielectric layer 500 is preferably suitable for a transistor adopted for SRAM devices formed at a cell region of a semiconductor device or a transistor that operates at an operating voltage of approximately 1.0V.

As a result, the entire gate dielectric layer may be constructed to have the thin portion, the medium-thickness portion, and the thick portion on the same semiconductor substrate 100.

The method for manufacturing the multi-thickness gate dielectric layer having the thin portion, medium portion, and thick portion allows the resultant gate dielectric layer to have a uniform thickness over each of the thick portion, the medium-thickness portion, and the thin portion. For this, the thick portion of the gate dielectric layer includes the first dielectric layer 210 and second dielectric layer 310 deposited thereon, the medium portion 210 includes the first dielectric layer 210, and the thin portion includes only the third dielectric layer 500.

While an example of the gate dielectric layer having three different thicknesses is explained in the second embodiment, it is also possible to embody a gate dielectric layer having more than three thicknesses. That is, additional layers, such as a fourth dielectric layer, formed of other dielectric materials can be sequentially formed on the second dielectric layer 300 presented in the second embodiment and successively etched.

Embodiment 3

Unlike the second embodiment, a third dielectric layer will be formed by deposition in the third embodiment. It will be understood that like reference numerals in the third and second embodiments represent like elements.

Figure 10:
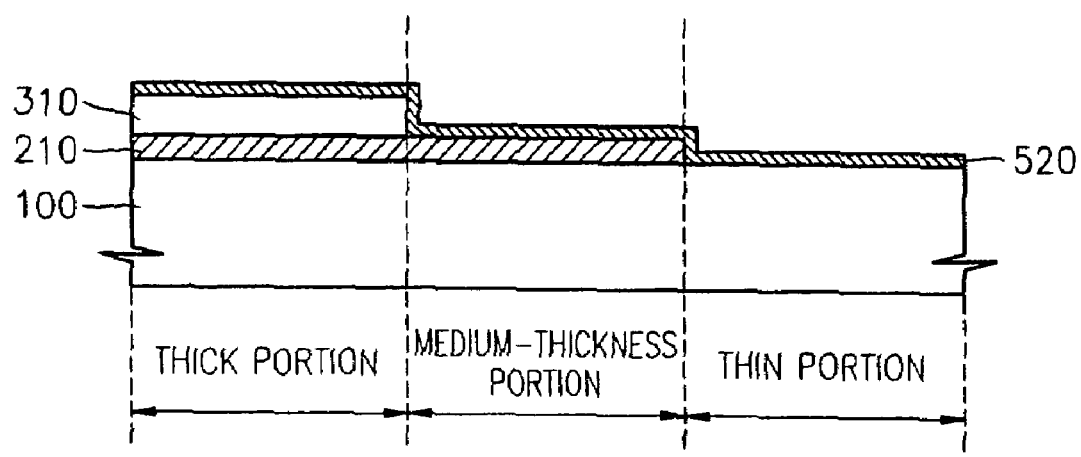
FIG. 10 is a schematic cross-sectional view illustrating a method for manufacturing a multi-thickness gate dielectric layer of a semiconductor device in accordance with a third preferred embodiment of the present invention.

FIG. 10 schematically illustrates a step of depositing a third dielectric layer 520 on the semiconductor substrate 100.

Referring to FIG. 10, as described in the second embodiment with reference to FIGS. 4 through 9, the remaining first dielectric layer 210 and second dielectric layer 310 are formed on the semiconductor substrate 100, and the third dielectric layer 520 is then deposited on the exposed semiconductor substrate 100. The third dielectric layer 520 may be formed of a dielectric material such as silicon oxide, silicon nitride, hafnium oxide, aluminium oxide, zirconium oxide, or tantalum oxide.

For instance, the third dielectric layer 520 may be formed of aluminium oxide or hafnium oxide using an ALD process, which has an advantage of embodying improved step coverage.

The third dielectric layer 520 is formed to constitute a relatively thin gate dielectric layer. Accordingly, the third dielectric layer 520 may, for example, have a thickness of approximately 1 to 20 Å, preferably, 10 to 12 Å. Thus, the third dielectric layer 520 including the third dielectric layer 500 is preferably suitable for a transistor adopted for SRAM devices formed at a cell region of a semiconductor device or a transistor operated at an operating voltage of approximately 1.0V.

As a result, the entire gate dielectric layer may be constructed to have the thin portion, medium-thickness portion, and thick portion on the same semiconductor substrate 100.

The method for manufacturing the multi-thickness gate dielectric layer having the thin portion, medium-thickness portion, and thick portion allows the resultant gate dielectric layer to have a uniform thickness over each of the thick portion, the medium-thickness portion, and the thin portion. For this, the thick portion of the gate dielectric layer includes the first dielectric layer 210, and the second and third dielectric layers 310 and 520 deposited thereon, the medium-thickness region includes the first and third dielectric layers 210 and 520, and the thin portion includes only the third dielectric layer 520.

Since all the thicknesses of the layers constituting the gate dielectric layer are adjusted during the deposition or growth thereof, the entire gate dielectric layer may be formed to a highly uniform thickness in each region of the layers.

According to the present invention, layers formed of different kinds of dielectric materials are sequentially deposited or grown and then successively removed, thus resulting in a gate dielectric layer having multiple thicknesses on a semiconductor substrate. Consequently, each of the respective layers constituting the entire gate dielectric layer may be formed to have a uniform thickness in each region.

While the present invention has been particularly shown and described with reference to preferred embodiments thereof, it will be understood by those of ordinary skill in the art that various changes in form and details may be made therein without departing from the spirit and scope of the present invention as defined by the following claims.

What is claimed is:

1. A method for manufacturing a semiconductor device including first and second transistors having different gate dielectric layer thicknesses, the method comprising:

forming a first dielectric layer on a semiconductor substrate of a first thickness;

forming a second dielectric layer of a second thickness on a top surface of the first dielectric layer, the second dielectric layer having a different dielectric material from that of the first dielectric layer; and selectively removing a portion of the second dielectric layer with etch selectivity to the first dielectric layer so as to selectively expose a portion of the top surface of the first dielectric layer under the second dielectric layer to form a gate dielectric layer including a thick portion formed of the first dielectric layer and remaining second dielectric layer in a first region of the semiconductor device and a thin portion formed of the exposed first dielectric layer in a second region of the semiconductor device, the thin portion being of the first thickness and the thick portion being of a combined thickness of the first thickness and the second thickness;

forming a first transistor in the first region, the first transistor including a first gate dielectric layer comprising a portion of the thick portion of the gate dielectric layer and a second transistor in the second region, the second transistor including a second gate dielectric layer comprising a portion of the thin portion of the gate dielectric layer.

2. The method as claimed in claim 1, wherein the first dielectric layer or the second dielectric layer is formed of a material selected from the group consisting of: silicon oxide, silicon nitride, hafnium oxide, aluminum oxide, zirconium oxide, and tantalum oxide.

3. The method as claimed in claim 1, wherein the first dielectric layer is formed of thermal oxide.

4. The method as claimed in claim 1, wherein the first dielectric layer is formed of silicon oxide using rapid thermal oxidation.

5. The method as claimed in claim 1, wherein the first dielectric layer or the second dielectric layer is formed of hafnium oxide or aluminum oxide using atomic layer deposition.

6. The method as claimed in claim 1, wherein the selective removal of the second dielectric layer comprises:

applying a photoresist pattern on the second dielectric layer; and etching the exposed second dielectric layer adopting a dry or wet etch process by using the photoresist pattern as an etch mask.

7. The method as claimed in claim 6, wherein the etching process is performed such that an etch rate of the second dielectric layer is higher than that of the first dielectric layer.

8. The method as claimed in claim 1, further comprising nitridizing a surface of the gate dielectric layer.

9. The method as claimed in claim 1, further comprising forming a third dielectric layer using a different dielectric material from that of the second dielectric layer, on the second dielectric layer; and selectively removing a portion of the third dielectric layer so as to selectively expose the second dielectric layer under the third dielectric layer, wherein the gate dielectric layer in the thick portion includes the remaining third dielectric layer, second dielectric layer, and first dielectric layer, which are stacked.

* * * * *